(12) United States Patent
Wang et al.

(10) Patent No.: US 10,247,802 B2
(45) Date of Patent: Apr. 2, 2019

(54) SIGNAL INHOMOGENEITY CORRECTION AND PERFORMANCE EVALUATION APPARATUS

(71) Applicants: OHIO STATE INNOVATION FOUNDATION, Columbus, OH (US); YALE UNIVERSITY, New Haven, CT (US)

(72) Inventors: Jinghua Wang, Columbus, OH (US); Zhong-lin Lu, Dublin, OH (US); Robert Todd Constable, Madison, CT (US)

(73) Assignees: Ohio State Innovation Foundation, Columbus, OH (US); Yale University, New Haven, CT (US)

( * ) Notice: Subject to any disclaimer, the term of this patent is extended or adjusted under 35 U.S.C. 154(b) by 639 days.

(21) Appl. No.: 14/776,808

(22) PCT Filed: Mar. 14, 2014

(86) PCT No.: PCT/US2014/027580
§ 371 (c)(1),
(2) Date: Sep. 15, 2015

(87) PCT Pub. No.: WO2014/152652
PCT Pub. Date: Sep. 25, 2014

(65) Prior Publication Data
US 2016/0018502 A1 Jan. 21, 2016

Related U.S. Application Data

(60) Provisional application No. 61/792,112, filed on Mar. 15, 2013.

(51) Int. Cl.
G01R 33/565 (2006.01)
G01R 33/24 (2006.01)
(Continued)

(52) U.S. Cl.
CPC ....... *G01R 33/5659* (2013.01); *G01R 33/246* (2013.01); *G01R 33/485* (2013.01);
(Continued)

(58) Field of Classification Search
CPC .............. G01R 33/5659; G01R 33/246; G01R 33/4806; G01R 33/4818; G01R 33/485; G01R 33/586
See application file for complete search history.

(56) References Cited

U.S. PATENT DOCUMENTS

| 4,731,865 A | 3/1988 | Sievenpiper |
| 5,551,431 A | 9/1996 | Wells, III et al. |

(Continued)

FOREIGN PATENT DOCUMENTS

WO 2010032172 A1 3/2010

OTHER PUBLICATIONS

International Search Report and Written Opinion of the USPTO International Searching Authority from Application No. PCT/US2014/027580, dated Jul. 8, 2014.
(Continued)

*Primary Examiner* — Gregory H Curran
(74) *Attorney, Agent, or Firm* — Meunier Carlin & Curfman LLC

(57) ABSTRACT

Methods for correcting inhomogeneities of magnetic resonance (MR) images and for evaluating the performance of the inhomogeneity correction. The contribution of both transmit field and receiver sensitivity to signal inhomogeneity have been separately considered and quantified. As a result, their negative contributions can be fully corrected. The correction method can greatly enhance the accuracy and precision of MRI techniques and improve the detection sensitivity of pathophysiological changes. The performance of signal inhomogeneity correction methods has been evalu-
(Continued)

ated and confirmed using phantom and in vivo human brain experiments. The present methodologies are readily applicable to correct signal intensity inhomogeneity artifacts produced in different imaging modalities, such as computer tomography, X-ray, ultrasound, and transmission electron microscopy.

15 Claims, 13 Drawing Sheets

(51) Int. Cl.
G01R 33/48 (2006.01)
G01R 33/485 (2006.01)
G01R 33/58 (2006.01)

(52) U.S. Cl.
CPC ...... *G01R 33/4806* (2013.01); *G01R 33/4818* (2013.01); *G01R 33/586* (2013.01)

(56) References Cited

U.S. PATENT DOCUMENTS

| | | | |
|---|---|---|---|
| 5,914,599 A | 6/1999 | Sharp | |
| 5,943,433 A | 8/1999 | Avinash | |
| 6,208,138 B1 | 3/2001 | Lai et al. | |
| 6,215,911 B1 | 4/2001 | Goertler et al. | |
| 6,268,728 B1 | 7/2001 | Morrell | |
| 6,587,708 B2 | 7/2003 | Venkatesan et al. | |
| 6,701,025 B1 | 3/2004 | Avinash | |
| 6,757,442 B1 | 6/2004 | Avinash | |
| 7,088,099 B2 | 8/2006 | Doddrell et al. | |
| 7,218,107 B2 | 5/2007 | Fuderer | |
| 7,432,707 B1 | 10/2008 | Boitano | |
| 7,443,164 B2 | 10/2008 | Clarke et al. | |
| 7,603,157 B2 | 10/2009 | Feiweier et al. | |
| 7,672,498 B2 | 3/2010 | Jellus | |
| 7,782,056 B2 | 8/2010 | Noterdaeme et al. | |
| 7,894,668 B1 | 2/2011 | Boitano | |
| 8,018,230 B2 | 9/2011 | Zaitsev et al. | |
| 8,077,955 B2 | 12/2011 | Dannels et al. | |
| 8,213,715 B1 | 7/2012 | Boitano | |
| 8,224,048 B2 | 7/2012 | Hou et al. | |
| 8,558,547 B2 * | 10/2013 | Sacolick | G01R 33/5612 324/309 |
| 2010/0315087 A1 * | 12/2010 | Thulborn | G01R 33/3415 324/318 |
| 2011/0026799 A1 | 2/2011 | Nehrke et al. | |
| 2012/0032677 A1 | 2/2012 | Dannels | |
| 2013/0251227 A1 | 9/2013 | Wang et al. | |

OTHER PUBLICATIONS

Extended European Search Report, issued by the European Patent Office in Application No. 14769206.5 dated Aug. 10, 2017, 12 pages.
Hartwig, V. et al. (2011). B 1+/actual flip angle and reception sensitivity mapping methods: Simulation and comparison. Magnetic resonance imaging, 29(5), 717-722.
Neeb, H., Ermer, V., Stocker, T., & Shah, N. J. (2008). Fast quantitative mapping of absolute water content with full brain coverage. Neuroimage, 42(3), 1094-1109.
Thulborn, K. R., Boada, F. E., Shen, G. X., Christensen, J. D., & Reese, T. G. (1998). Correction of B1 inhomogeneities using echo-planar imaging of water. Magnetic resonance in medicine, 39(3), 369-375.
Venkatesan, R., Lin, W., & Haacke, E. M. (1998). Accurate determination of spin-density and T1 in the presence of RF-field inhomogeneities and flip-angle miscalibration. Magnetic resonance in medicine, 40(4), 592-602.
Ashburner, J., & Friston, K. J. (2005). Unified segmentation. Neuroimage, 26(3), 839-851.

Breuer, Felix A., et al. "Dynamic autocalibrated parallel imaging using temporal GRAPPA (TGRAPPA)." Magnetic Resonance in Medicine 53.4 (2005): 981-985.
Brey, William W., and Ponnada A. Narayana. "Correction for intensity falloff in surface coil magnetic resonance imaging." Medical Physics 15.2 (1988): 241-245.
Brunner, David O., and Klaas P. Pruessmann. "B 1+interferometry for the calibration of RF transmitter arrays." Magnetic Resonance in Medicine 61.6 (2009): 1480-1488.
Chang, Yulin V. "Rapid B1 mapping using orthogonal, equal-amplitude radio-frequency pulses." Magnetic Resonance in Medicine 67.3 (2012): 718-723.
Cunningham, Charles H., John M. Pauly, and Krishna S. Nayak. "Saturated double-angle method for rapid B1+ mapping." Magnetic Resonance in Medicine 55.6 (2006): 1326-1333.
Dai, Weiying, et al. "Sensitivity calibration with a uniform magnetization image to improve arterial spin labeling perfusion quantification." Magnetic Resonance in Medicine 66.6 (2011): 1590-1600.
Griswold, Mark A., et al. "Autocalibrated coil sensitivity estimation for parallel imaging." NMR in Biomedicine 19.3 (2006): 316-324.
Hoult, D. I., & Richards, R. E. (1976). The signal-to-noise ratio of the nuclear magnetic resonance experiment. Journal of Magnetic Resonance, 24(1), 71-85.
Insko, E. K., and L. Bolinger. "Mapping of the radiofrequency field." Journal of Magnetic Resonance, Series A 103.1 (1993): 82-85.
Jiru, F., and U. Klose. "Fast 3D radiofrequency field mapping using echo-planar imaging." Magnetic resonance in medicine 56.6 (2006): 1375-1379.
Liney, Gary P., Lindsay W. Turnbull, and Adrian J. Knowles. "A simple method for the correction of endorectal surface coil inhomogeneity in prostate imaging." Journal of Magnetic Resonance Imaging 8.4 (1998): 994-997.
McKenzie CA, Yeh EN, Ohliger MA, Price MD, Sodickson DK. "Self-calibrating parallel imaging with automatic coil sensitivity extraction." Magnetic Resonance in Medicine 47:529-38 (2002).
Morrell, Glen R. "A phase-sensitive method of flip angle mapping." Magnetic Resonance in Medicine 60.4 (2008): 889-894.
Murakami, James W., Cecil E. Hayes, and Ed Weinberger. "Intensity correction of phased-array surface coil images." Magnetic Resonance in Medicine 35.4 (1996): 585-590.
Pruessmann, Klaas P., et al. "SENSE: sensitivity encoding for fast MRI." Magnetic resonance in medicine 425 (1999): 952-962.
Sacolick, Laura I., et al. "B1 mapping by Bloch-Siegert shift." Magnetic Resonance in Medicine 63.5 (2010): 1315-1322.
Sled, John G., Alex P. Zijdenbos, and Alan C. Evans. "A nonparametric method for automatic correction of intensity nonuniformity in MRI data." Medical Imaging, IEEE Transactions on 17.1 (1998): 87-97.
Wang, Jinghua, et al. "Measurement and correction of transmitter and receiver induced nonuniformities in vivo." Magnetic Resonance in Medicine 53.2 (2005): 408-417.
Wang, Jinghua, Maolin Qiu, and R. Todd Constable. "In vivo method for correcting transmit/receive nonuniformities with phased array coils." Magnetic resonance in medicine 53.3 (2005): 666.
Wang J, Watzl J, Qiu M, de Graaf RA, Constable RT. "In vivo receive sensitivity measurement." Proc. ISMRM Seventeenth Annual meeting, Hawaii, USA (2009) p. 4564.
Watanabe, Hidehiro, Nobuhiro Takaya, and Fumiyuki Mitsumori. "Non-uniformity correction of human brain imaging at high field by RF field mapping of and." Journal of Magnetic Resonance 212.2 (2011): 426-430.
Yarnykh, Vasily L. "Actual flip-angle imaging in the pulsed steady state: a method for rapid three-dimensional mapping of the transmitted radiofrequency field." Magnetic resonance in medicine 57.1 (2007): 192-200.
Zhang Y, Brady M, and Smith S. "Segmentation of brain MR images through a hidden Markov random field model and the expectation-maximization algorithm." IEEE Trans. on Medical Imaging 20:45-57 (2001).

\* cited by examiner

SIGNAL INHOMOGENEITY CORRECTION AND PERFORMANCE EVALUATION APPARATUS

TECHNICAL FIELD OF THE DISCLOSURE

The field of the disclosure is Magnetic Resonance (MR) systems and methods and, more particularly, systems for correcting signal intensity inhomogeneity caused by non-tissue characteristics.

BACKGROUND OF THE DISCLOSURE

Inhomogeneity caused by non-tissue characteristics is an undesired and unavoidable artifact, which often adversely affects intensity-based qualitative and quantitative MR image analysis. It becomes more severe in higher magnetic fields and for objects with higher permittivity where the wavelength of the RF field in the objects is comparable with or less than the size of the objects. In MR imaging, imperfections of receiver and transmit coils, static magnetic field inhomogeneity, radio frequency (RF) penetration, gradient-driven eddy currents, and object-dependent electromagnetic interactions systematically cause the variations of signal intensities across images which is also referred as bias field, intensity non-uniformity, or shading. MR signal inhomogeneity presents a major challenge for magnetic resonance imaging (MRI) and magnetic resonance spectroscopy (MRS). More specifically, even subtle signal inhomogeneity can cause large degradation on image quality, which must be discounted by physicians when viewing images and therefore often obstructs diagnoses and causes treatment delays. Moreover, artificial intra-tissue variability caused by signal inhomogeneity affects automated image processing algorithms that rely on the assumption that a given tissue is represented by similar voxel intensities throughout the image. Subsequently, it reduces the accuracy of quantitative analyses and limits the detection sensitivity of computer-aided diagnosis. Finally, signal inhomogeneity increases inter-scanner variability. MR images acquired with similar protocols but on different scanners may generate dissimilar image intensities for the same tissue types due to different coil configurations and coupling between the coil and the to-be-imaged objects. The variabilities across different sites and time points in longitudinal studies are machine-dependant, and go beyond random or systematic errors that can be corrected. As a result, the number of required subjects have to be increased to improve statistical power. For example, to have statistically reliable and significant results, the Alzheimer's Disease Neuroimaging Initiative (ADNI) have spent $60-million over 5 years imaging and tracking more than 800 subjects.

Before the commencement of each MR scan, it is common practice to adjust the strength of the transmitted RF excitation field and the gain of the RF receiver to ensure that the RF excitation pulses have optimal frequency, strength, and duration to evoke the desired MR signal. This does not necessarily mean that the expected RF excitation field will be produced uniformly throughout the region of interest, or that the resulting MR signals will be received uniformly from all locations in the region of interest. RF field produced by most transmit coils after loading of the subject being studied is not homogeneous and the receive field of most receiver coils is also not homogeneous. This is particularly true for imperfect coil configurations, such as surface coil and phase array coils. Even if the transmit and receiver coil fields are homogeneous for free space or in the unloaded condition, wave behavior and penetration of the RF field into the subject may give rise to non-uniform transmit field and receiver sensitivity throughout the region of interest. Moreover, incorrect calibration of the RF pulse amplitude, instability or drift of the RF amplifier or other RF electronics, can lead to non-uniform transmit field. Also, mutual inductance between transmit and receiver coils may cause further inhomogeneities. Either inhomogeneous transmit or receiver sensitivity or both can give rise to ghost artifacts in signal intensity, and therefore restrict the application of MR techniques in research and clinical settings.

Methods for correcting MR signal inhomogeneities can be categorized into active and post-processing methods. The active methods are achieved through the applications of adiabatic pulses, compensation pulses, radiofrequency field shimming techniques, and parallel transmit techniques. Most of these active methods concentrate on the correction of signal inhomogeneity caused by transmit coils; while only parallel transmit techniques partially correct inhomogeneity caused by receiver coils. The post-process methods can be further classified into model-based (e.g. low-pass filtering, statistical modeling and surface fitting) and measurement-based methods (U.S. Pat. No. 6,757,442, Ainash 2004 from GE Medical Systems Global Technology Company; U.S. Pat. No. 7,218,107, Fuderer 2007 from Koninklijke Philips Electronics N.V.; U.S. Pat. No. 7,672,498, Jellus 2010 from Siemens Aktiengsellschaft; U.S. Pat. No. 7,894,668, Boitano 2011 and U.S. Pat. No. 8,213,715, Boitano 2012 from Fonar Corporation). Most model-based methods are usually established on the assumption that MR signal inhomogeneity changes slowly and smoothly. Since the configurations of the objects being imaged are very complex, the assumption is sometimes not valid. Moreover, the model-based methods usually do not consider the influence of image acquisition and the imaged object on the inhomogeneities. These methods require some huge initial effort and extensive skills to select the right model and correct setting. Measurement-based methods, on the other hand, inclusively incorporate prior knowledge about factors that affect signal inhomogeneity into the correction. [Brey W W, Narayana P A. 1988; Murakami J W et al. 1996; Liney G P et al. 1998, U.S. Pat. No. US2012/0032677 A1 Dannels (2012) from Toshiba Medical System Corporation].

A number of methods have been proposed for estimating transmit field in vivo. These methods can be categorized into MR amplitude based and M R phase based methods. M R amplitude based methods include the double flip angle method [Insko E K et al, 1993; Cunningham C H et al 2006], dual pulse spin echo method [Jiru F et al, 2006], actual flip angle imaging method [Yarnykh V L, 2007], and stead state method [Brunner et al, 2009]. M R phase based methods include Bloch Siegert shift method [Sacolick et al. 2010], and phase method [Morell D G 2008; Chang Y V, 2012]. Various methods have also been proposed for estimating receiver sensitivity in vivo. These methods can be categorized into intensity-based, field-based and k-space calibration methods. Intensity-based methods include the pre-scan method (Pruessmann et al, 1999), minimal contrast method (Wang J et al, 2005a and 2005b), and uniform magnetization method (Dai W et al, 2011). Field-based methods include the reciprocity principle method (Hoult D I et al, 1976), rotating-object method (Wang J et al, 2009), calibration from transmit field (Watanabe H, 2011), and electromagnetic field method (Wang J et al 2013, US 20130251227 A1). Because coil sensitivity varies slowly and smoothly over space, the k-space calibration methods have also been used to estimate receiver sensitivity for parallel imaging reconstruction (Griswold M A et al, 2006; Breuer F A et al, 2005; McKenzie C A et al, 2007).

Thus, signal intensity inhomogeneity correction is a challenging problem involving multiple communities with different objectives. Performance evaluation is a consideration for the investigation of consistency among methods as well as for the optimization of existing and development of novel correction methods. Due to the lack of ground-truth, direct evaluation using experimentally collected human subject MR data is not feasible. The most commonly used evaluation is based on computer simulations. However, because it is difficult to describe MR scanner procedures exactly, most existing simulation based performance evaluation methods yield poor validity scores and often lead to conflicting statements. In the present disclosure, phantom and in vivo experiments are used to evaluate the performance of various signal inhomogeneity correction methods.

SUMMARY OF THE DISCLOSURE

The present disclosure is directed to a novel in vivo method for correcting MR signal inhomogeneity. The inhomogeneities caused by transmit field and receiver sensitivity are quantified separately and used to perform inhomogeneity correction. The method can enhance the accuracy and precision of MR imaging and MR spectroscopy techniques and improve the detection sensitivity of pathophysiological changes. To investigate the consistencies among different algorithms and to provide end users with a rational basis for selecting a specific inhomogeneity correction method for a certain scientific application, the present disclosure also includes the method and apparatus to evaluate the performance of various signal inhomogeneity correction methods.

Various factors, such as the receiver coil, transmit coil and magnetic field variations, uncompensated eddy currents, wave behavior and object positioning, generate MR signal inhomogeneities. Among them, coil configuration and wave behavior are primary sources. They lead to not only inhomogeneous transmit field but also inhomogeneous receiver sensitivity. In the present disclosure, the contribution of both transmit field and receiver sensitivity to signal inhomogeneity are separately considered and quantified. As a result, their negative contributions can be fully corrected. The performance of signal inhomogeneity correction methods has been evaluated and confirmed using phantom and in vivo human brain experiments. The methods are readily applicable to correct signal intensity inhomogeneity artifacts produced by different imaging modalities, such as computer tomography (CT), X-ray, ultrasound, and transmission electron microscopy (TEM). The correction methods are based on qualified reasons which lead to the signal intensity inhomogeneity in the different imaging modalities.

Thus, in accordance with aspects of the disclosure, there is described a method that may include: producing a set of signal intensity images using various sequences and imaging parameters in vivo; estimating the relative flip angle maps or relative transmit field maps with the images acquired; estimating the maps of all pulses (radio frequency pulse, refocusing pulse and magnetization preparation pulses) if the sequence includes different radiofrequency pulses or refocusing pulses or magnetization preparation pulses; estimating transmit function of the images being corrected according to Bloch's equation and the relative flip angle corresponding to the given flip angle; estimating the receiver sensitivity maps; calculating a relative correction image from the transmit function and the receiver sensitivity; registering the relative correction image to the images being corrected for obtaining correction matrixes or images; normalizing the relative correction image; and correcting inhomogeneous signal intensity with the correction matrixes or images.

Performance evaluation is performed to investigate consistency among methods as well as to optimize existing and develop novel correction methods. Due to the lack of ground-truth, a direct evaluation is not feasible. Most commonly used evaluation is based on computer simulations. However, because it is difficult to describe MR scanner procedures exactly, most existing performance evaluation methods yield poor validity scores and often lead to conflicting statements. In the present disclosure, phantoms and human subjects are used to evaluate the performance of various signal inhomogeneity correction methods.

Thus, in accordance with other aspects of the disclosure, there is described a method that may include: producing a set of signal intensity images of a uniform phantom using various sequences and imaging parameters in vivo; evaluating the performance of signal inhomogeneity correction methods; producing a set of signal intensity images of phantoms with multiple contrasts (representing multiple tissue types) and in vivo human bodies using various sequences and imaging parameters in vivo; measuring the exact volume of each tissue component to serve as the ground-truth using physical and chemical methods; correcting signal inhomogeneities with various methods and different parameters; segmenting the corrected images and estimating the volume of each tissue component; and evaluating the performance or image quality of various methods by comparing tissue volumes, contrasts, signal intensities and noises estimated from the segmentations and those obtained from the physical and chemical methods. The best method will have the best image quality, such as the smallest standard deviation of signal intensity for the uniform phantom and the largest contrast or contrast-to-noise of the multiple tissue phantoms. Additionally, it will be robust and less variable across sequences and imaging parameters.

This summary is provided to introduce a selection of concepts in a simplified form that are further described below. This summary is not intended to identify key features or essential features of the claimed subject matter, nor is it intended that this summary be used to limit the scope of the claimed subject matter.

BRIEF DESCRIPTION OF THE DRAWINGS

In the drawings, the same reference numbers and acronyms identify elements or acts with the same or similar functionality for ease of understanding and convenience.

DETAILED DESCRIPTION OF THE DISCLOSURE

Introduction

Figure 1:
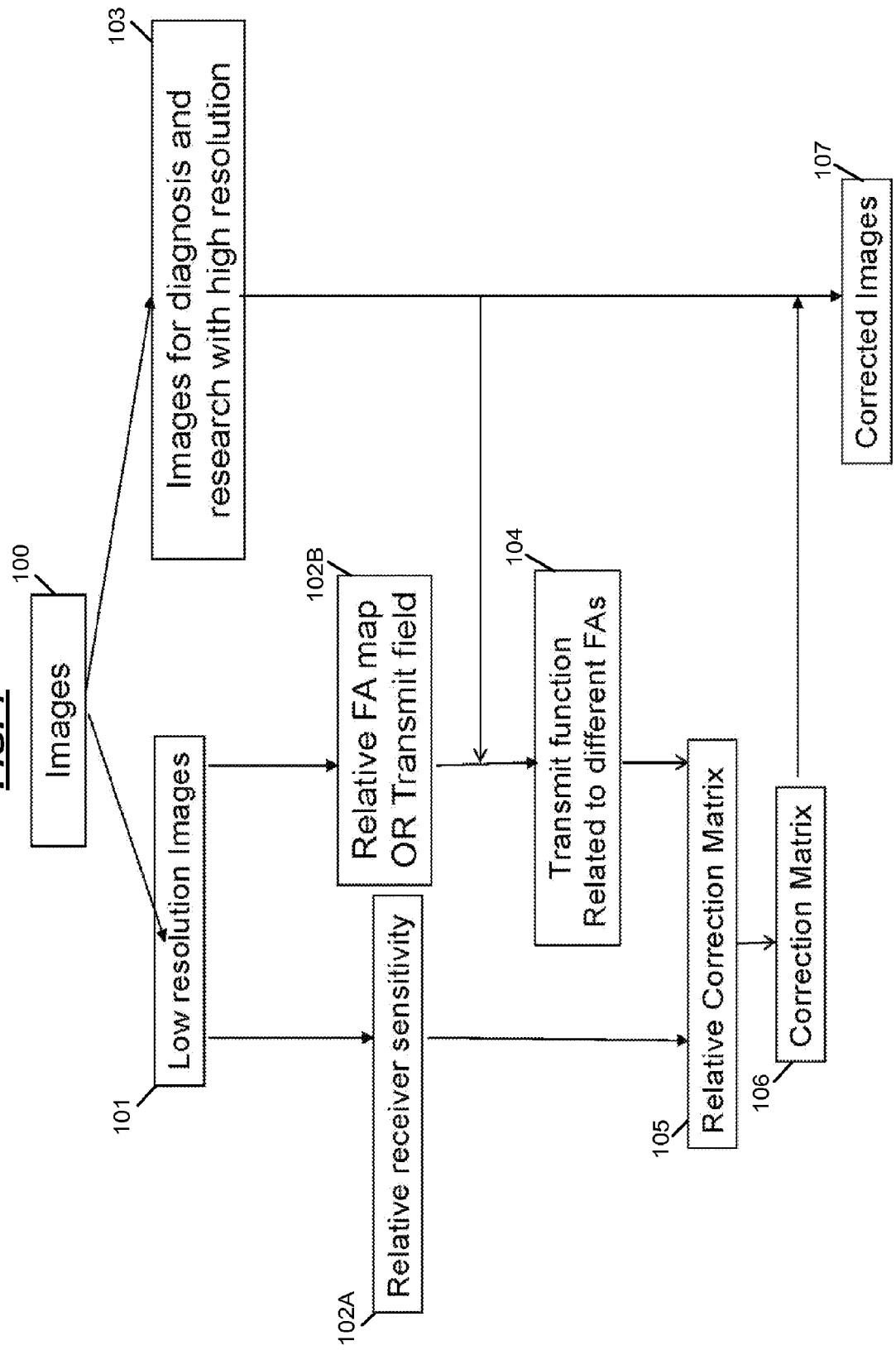
FIG. 1 illustrates a flowchart employed in a magnetic resonance imaging system suitable for correcting inhomogeneous signal intensity with estimated transmit field and receiver sensitivity.

The present disclosure describes methods for correcting image inhomogeneity using a correction matrix of the to-be-corrected images:

$$SI_{corrected} = SI_{measured}/SI_{correction}, \quad (1)$$

Where $SI_{Corrected}$ is the corrected signal, signal $SI_{measured}$ is the measured signal, and $SI_{Corrected}$ is the correction matrix of the to-be-corrected images. The correction matrix or bias field can be calculated from transmit function and receiver sensitivity as follows:

$$SI_{correction} = F(x) \cdot S(x), \quad (2)$$

where $F(x)$ is the corresponding transmit function, and $S(x)$ is receiver sensitivity. The transmit function of the to-be-corrected image $F(x)$ is calculated according to the measured transmit field and Bloch's equation that corresponds to the acquired image.

1. Single Radiofrequency Pulse

The simplest MRI radiofrequency pulse only includes a type of radiofrequency pulse shape which can be one of sinc pulse, Gaussian pulse, truncated-sinc, hard pulse, composite pulse and tailored pulse. For a given hardware and loaded object, such as coil system and magnetic field strength, the transmit field inhomogeneity will be consistent. The flip angle has a linear relationship with the product of transmit field Bland pulse duration time τ. For example, the transmit function $F_{GE}(x)$ of either ideal steady-state gradient-echo sequence or gradient echo planar imaging sequence with an excitation flip angle of α(x) can be approximated as:

$$F_{GE}(x) = M_0 \cdot \frac{(1-E_1) \cdot \sin\alpha(x)}{1 - E_1 \cdot E_2 - (E_1 - E_2) \cdot \cos\alpha(x)} \cdot e^{-\frac{TE}{T_2}}, \quad (3)$$

where $E_1 = \exp(-TR/T_1)$, $M_0$ is the equilibrium longitudinal magnetization, $T_1$ is the longitudinal relaxation time, $E_2 = \exp(-TR/T_2^*)$. The corrected flip angle $\alpha_{GE}(x)$ for the nominal flip angle α(x) can be calculated by:

$$\alpha_{GE}(x) = \alpha(x) \cdot \left(\frac{\gamma B_1^+ \tau}{\alpha_{1,GE}}\right), \quad (4)$$

where $\alpha_{1,GE}$ and τ are the nominal input excitation flip angle and pulse length of the radio-frequency pulse used for determining $B_1^+$. The calculated flip angles are based on the assumption of a linear relationship between flip angle and $B_1^+$ map. For $TR \gg T_2^*$, $E_2 = 0$, and Eq. (3) can be simplified as:

$$F_{GE}(x) = M_0 \cdot \sin\alpha_{GE}(x) \cdot \frac{(1-E_1)}{1 - E_1 \cdot \cos\alpha_{GE}(x)} \cdot e^{-\frac{TE}{T_2}}. \quad (5)$$

The variables that depend on the properties of the tissue (proton density, $T_1$ and $T_2$) in Eq. (5) are ignored or replaced with averaged tissue parameters. When $TR \gg T1$ and $TE \ll T_2$, Eq. (5) can be further simplified to:

$$F_{GE}(x) \propto \sin \alpha_{GE}(x) \quad (6)$$

Various methods, such as the double flip angle method [Insko E K et al, 1993; Cunningham C H et al 2006], dual pulse spin echo method [Jiru F et al, 2006], actual flip angle imaging method [Yarnykh V L, 2007], steady state method [Brunner et al, 2009], Bloch Siegert shift method [Sacolick et al. 2010], and phase method [Morell D G 2008; Chang Y V, 2012], can be used to estimate the transmit field B. Here the transmit field or flip angle map is estimated using the double flip angle method with a segmented gradient-echo EPI sequence [Wang J et al, 2005a and 2005b]:

$$B_1^+ = \frac{1}{\gamma\tau} \cdot \arccos\left(\frac{\lambda_{GE}}{2}\right), \quad (7)$$

where the ratio of signal intensities of two gradient-echo images with different flip angles $\alpha_{1,GE}(X)$ and $2\alpha_{1,GE}(X)$ is given by:

$$\lambda_{GE} = \sin 2\alpha_{2,GE}(x)/\sin \alpha_{1,GE}(x) = 2 \cos \alpha_{1,GE}(x), \quad (8)$$

Various methods, such as the pre-scan method (Pruessmann et al, 1999), minimal contrast method (Wang J et al, 2005a and 2005b), uniform magnetization method (Dai W et al, 2011), the reciprocity principle method (Hoult D I et al, 1976), rotating-object method (Wang J et al, 2009), calibration from transmit field (Watanabe H, 2011), and bias field method (Wang J et al, 2012), have been developed to estimate receiver sensitivity. Additionally, receiver sensitivity may also be estimated from k-space data (Lei Ying and Huang Fei et al).

In the present disclosure, receiver sensitivity may be estimated using the minimal contrast method. For a uniform phantom, the inhomogeneity signal mainly results from non-uniform transmit field and receiver sensitivity. The contribution of the transmit field to the inhomogeneous signal can be calculated from the measured transmit field. Receiver sensitivity can be calculated using:

$$S(x) = SI_{MC}(x)/F_{MC}(x) \tag{9}$$

where $SI_{MC}(x)$ and $F_{MC}(x)$ are signal intensity and transmit function of the uniform phantom. If a heterogeneous object includes three or more tissues, TE and TR can be chosen to minimize the contrast among all the tissues, although in this case some contrast will remain. In this case, the heterogeneous object can be approximated by a uniform object, and its receiver sensitivity can be estimated using Eq. (9).

2. Combination of Multi Pulses.

Many image sequences may include different pulses, such as variable radiofrequency pulses, refocusing pulses and magnetization preparation pulses. For example, spin echo sequence, echo planar spin echo imaging sequence and fast spin echo sequence all include refocusing pulses. It is assumed that wave behavior is the dominant factor that introduces the difference in transmit field inhomogeneity for most routine pulses when coil configuration and loaded object are given. That is, the effect of pulse shape and $B_0$ inhomogeneity on transmit field is negligible. It is noticed that the assumption is not valid for phase modulation radiofrequency pulses, adiabatic pulses. In that case, the transmit function of a spin-echo sequence $F_{SE}(x)$ can be obtained by solving the Bloch's equation as follows:

$$F_{SE}(x) = M_0 \frac{\sin\alpha_{SE}(x) \cdot [1 - \cos(\beta_{SE}(x))] \cdot \left[ \begin{array}{c} 1 - \cos\beta_{SE}(x) \cdot E_1 - \\ (1 - \cos\beta_{SE}(x)) \cdot E_1 \cdot e^{\frac{TE}{2T_1}} \end{array} \right]}{1 - \cos\alpha_{SE}(x) \cdot \cos\beta_{SE}(x) \cdot E_1} \cdot e^{-\frac{TE}{T_2}} \tag{10}$$

where $\alpha_{SE}(x)$ and $\beta_{SE}(x)$ are the corrected flip angles of the excitation and refocusing pulses using Eq. (6) at position x. When $T_1 \gg TE$ and $TR \gg T_1$, Eq. (4) can be simplified to:

$$F_{SE}(x) \propto \sin\alpha_{SE}(x) \cdot \sin^2 \frac{\beta_{SE}(x)}{2}. \tag{11}$$

According to the assumption, $\alpha_{SE}(x)$ should be proportional to $\beta_{SE}(x)$. Therefore the refocusing pulse can be estimated from the measured $\alpha_{SE}(x)$.

The magnetization preparation pulses include (i) 180° RF inversion pulse, (ii) a saturation pulse (usually 90° RF pulse), and (iii) a magnetization transfer pulse. Like refocusing pulse, the maps of the magnetization preparation pulses can be estimated by measured $\alpha_{SE}(x)$ The maps of the combined pulses may be obtained using the measured $\alpha_{SE}(x)$. The transmit function for the sequence is estimated using Bloch's equation. For example, the MP-RAGE sequence is composed of 3D-inversion recovery α and N equally-spaced readout RF pulses of flip angle θ and echo spacing τ. Repetition time TR is defined as the time interval between two successive inversion recovery pulses:

$$TR = TI + N \cdot \tau + TD, \tag{12}$$

where τ is echo spacing time, N is the total number of readout RF pulses, TI is the time interval between the inversion recovery pulse and the first RF readout pulse, and TD is delay time. In order to simplify the formula for signal intensity, the following may be defined: $\delta = \exp(-\tau/T_1)$. For successive excitations in the MP-RAGE sequence, signal intensity from the $i^{th}$ read-out pulse is given by:

$$F_{MPRAGE}(x) = M_0 \cdot \sin(\theta) \cdot \exp\left(-\frac{TE}{T_2^*}\right) \cdot \left\{ \frac{1-\delta}{1-\delta \cdot \cos(\theta)} + [1 - \cos(\alpha)] \cdot \exp(-TI/T_1) \right\}, \tag{13}$$

Inversion recover fast spin echo sequence is composed of inversion recovery pulse θ, the radiofrequency pulse α, and N equally-spaced refocusing pulse of flip angle β and echo spacing τ. Repetition time TI is defined as the time interval between inversion recovery pulse and the radiofrequency pulse. The transmit function is given by:

$$F_{SE}(x) \approx M_0 \{1 - [1 - \cos(\theta)] \cdot \exp(-TI_{eff}/T_1)\} \cdot [\sin(\alpha)] \cdot [1 - \cos(\beta)], \tag{14}$$

where the effective inversion recovery time $TI_{eff}$ is a major determining factor of image contrast. It is defined as the time interval between the inversion recover pulse and the refocusing read-out pulse for k-space center. If the $i^{th}$ read-out pulse corresponding to expected image contrast is used to fill k-space center, $TI_{eff}$ is given by:

$$TI_{eff} = TI + i^* \tau = TI + TE_{eff}. \tag{15}$$

3. Variable Imaging Parameter Sequences

With regard to variable imaging parameter sequences, such as MPRAGE or 3D fast spin echo sequence (SPACE in Siemens Healthcare, CUBE in GE Healthcare, and vista Philips Healthcare), each k-space line corresponds to different imaging parameters (such as inversion recovery time, echo time, and flip angle). The imaging parameters used for inhomogeneity correction should be the effective imaging parameters used in acquiring the k-space zero line or the center of k-space.

In order to quantitatively evaluate the variability of an image parameter, the coefficient variation (CV) may be introduced:

$$CV = \frac{\sigma}{\mu}, \tag{16}$$

where σ and μ are the standard deviation and mean of the specific parameter. The smaller the CV, the more uniform the parameter or the smaller the variability. When CV is equal to zero, the parameter is perfectly uniform.

Implementation and Results

FIG. 1 is a simplified flowchart employed in an MRI system suitable for correcting inhomogeneous signal intensity with estimated transmit field and receiver sensitivity. Initially, at 100, images are provided to the system. At 101, low resolution images are used to measure the receiver sensitivity (at 102A) and transmit field or relative flip angle (at 102B). At 103, images are acquired that are used for diagnosis and research. These may be high resolution images in which inhomogeneities are to be corrected. At 104, an estimate of the transmit function is made using, e.g., the transmit field and Bloch's equation of the to-be-corrected images. From the estimate, the transmit function may be calculated with the flip angle $\alpha_3$ according to Bloch's equation. At 105, a relative correction matrix is estimated according to the transmit function and receiver sensitivity. The relative correction matrixes may be registered into the images being corrected. At 106, the relative correction matrixes are normalized to obtain correction matrices. At 107, the inhomogeneous signal intensity of the images is corrected by taking the ratio of high resolution images and their corresponding correction matrices.

Figure 2:
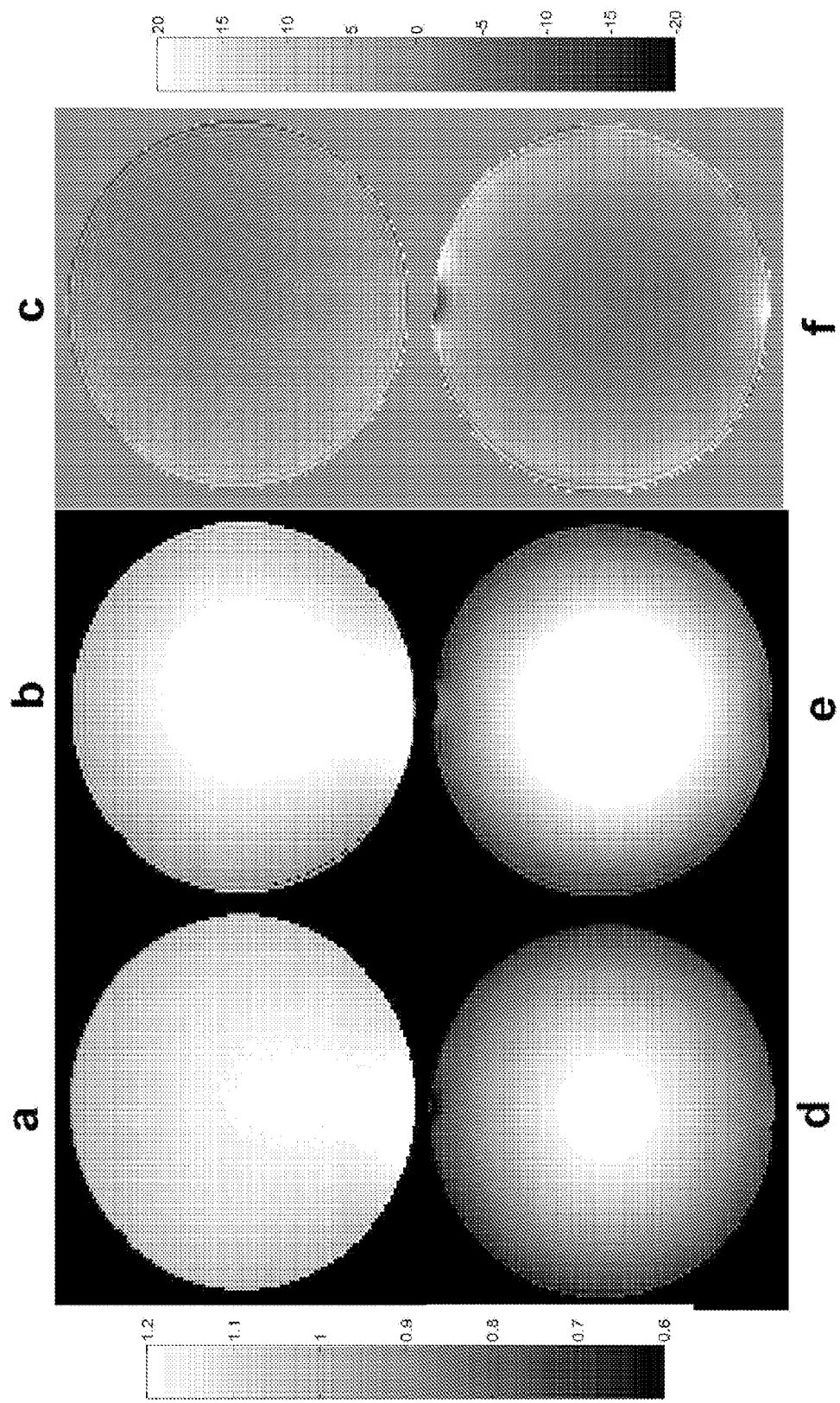
FIG. 2 illustrates a measured transmit RF field (a, d), receiver sensitivity (b, e) and their differences (c, f) of a uniform phantom at 1.5 (a-c) and 3.0 Tesla (d-f), respectively. The transmit field and receiver sensitivity have been normalized by their averages.

FIG. 2 shows the distributions of the measured RF transmit field (a, d), receiver sensitivity (b, e) and their differences (c, f) of a uniform phantom at 1.5 (a-c) and 3.0 Tesla (d-f) Tesla with a transmit/receiver body coil, respectively. With increasing Larmor frequencies, the transmit field and receiver sensitivity become more inhomogeneous. The maximum difference between transmit field and receiver sensitivity is about 10% at 1.5 Tesla, which is much larger than the error of the measured transmit field and receiver sensitivity (about 2%). These results demonstrates significant difference between the transmit field and receiver sensitivity with scanner static magnetic field above 1.5 T with a transmit/receiver coil. As the static field strength increases to 3.0 T, the maximum difference increases up to around 20%. In MR experiments, receiver sensitivity is sometimes approximated by the transmit field of the receiver coil according to the reciprocity principle. This is only valid in low field strengths. Replacing receiver sensitivity with transmit field can introduce large errors at high field strengths.

Figures 3A, 3B:
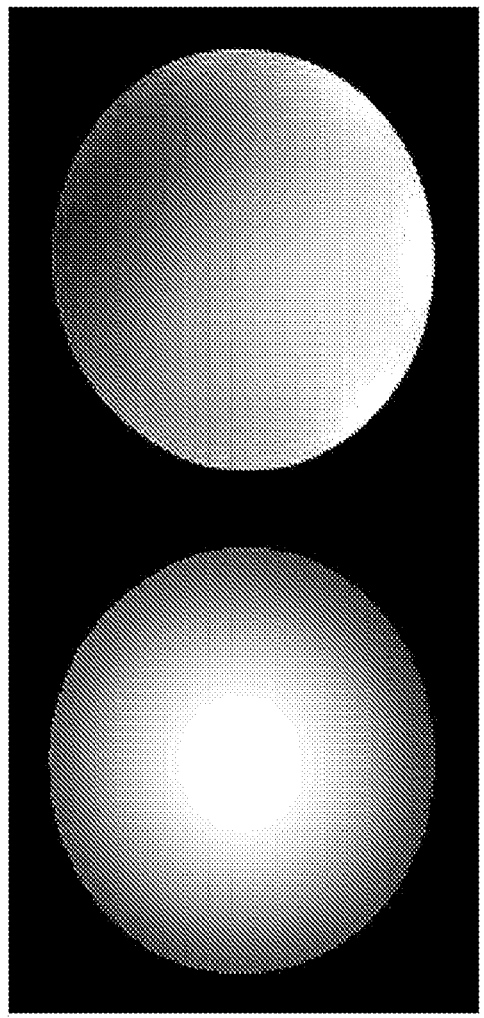
FIG. 3 illustrates a calculated transmit field map for the body coil (a) and the receiver sensitivity map of the phased array coil (b).

The transmit field of the body coil and the receiver sensitivity of phased array coil for a homogeneous phantom are calculated and shown in FIGS. 3A and 3B. With complete intensity uniformity the SD and therefore a should be the inverse of the image signal-to-noise ratio (SNR). In the case of the phantom, CV of the transmit field of the body coil is 14.7%, and CV of the receiver sensitivity for the phased array coil is 15.7%. The signal inhomogeneities in the images obtained with this hardware, then clearly result from not only the receiver sensitivity profile of the phased array coil, but also the transmit profile of the body coil. Although the contribution of body coil transmit to signal non-uniformities is smaller than the contribution of the phased array coils' reception at fields below 1.5 Tesla, the former can be comparable to, or larger than the latter at higher fields, such as 3.0 Tesla. Thus the contribution of the transmit profile cannot be ignored. For the same reason, if the body coil is used as a reference for correcting the signal non-uniformities with phased array data at high field, significant errors can arise since such a calculation assumes a uniform transmit profile.

Various methods, including the Nonparametric nonuniform intensity normalization (N3) approach [Sled J G et al, 1998], SPM tools [Ashburner J and Friston K J, 2005], and FSL-FMRIB [Zhang Y et al., 2001], have been proposed to estimate the bias field or signal intensity inhomogeneity of acquired images. In the N3 method, the bias field is estimated by sharpening the intensity histogram using Gaussian devolution and smoothing using a cubic B-spline. The smoothing of the bias field has a significant impact on the performance of the correction method. Conventional filtering techniques can introduce tissue boundary or eddy artifact and degrade the accuracy of bias field estimation. Spline approximation incorporating smoothness constraints is used to reduce the artifact on tissue boundaries. This method is independent of pulse sequence, imaging parameters, and insensitive to pathological change. In SPM tools, the bias field is based on the Gaussian mixture tissue model, Expectation-Maximization algorithm and Levenberg-Marquardt optimization. In FSL-FMRIB tools, the estimation of bias field is based on a hidden Markov random field model and an associated EM algorithm [Zhang Y et al., 2001]. The field map method was proposed for correcting the signal intensity inhomogeneities from non-tissue characteristics based on the estimating the transmit field and receiver sensitivity [Wang J et al., 2005a and 2005 b].

Figure 4:
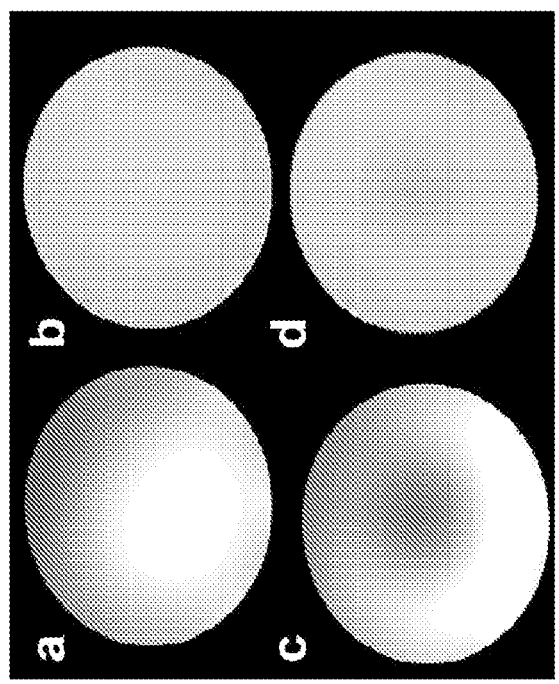
FIG. 4 illustrates a transmitted field map (a) and receiver sensitivity map (b) calculated using the MR method, wherein an uncorrected T1-weighted image is shown in (c), and the corrected image is shown in (d), obtained from the maps in (a) and (b).

The original gradient echo image and spin echo image, and the corresponding corrected images using the field map method, are shown in FIGS. 4A-4D respectively. In the original images (FIGS. 4A and 4C), significant signal intensity inhomogeneities are observed. In FIGS. 4B and 4D, the field map method corrects the intensity inhomogeneity throughout the image and does not lead to artifacts at the boundaries of the phantom. Quantitative comparisons of these methods are provided by the variation coefficient. The averaged CV is reduced from around 20% before correction to about 13% in the corrected images for the gradient echo image, and from 20% before correction to about 9% for the spin echo image.

Figure 5:
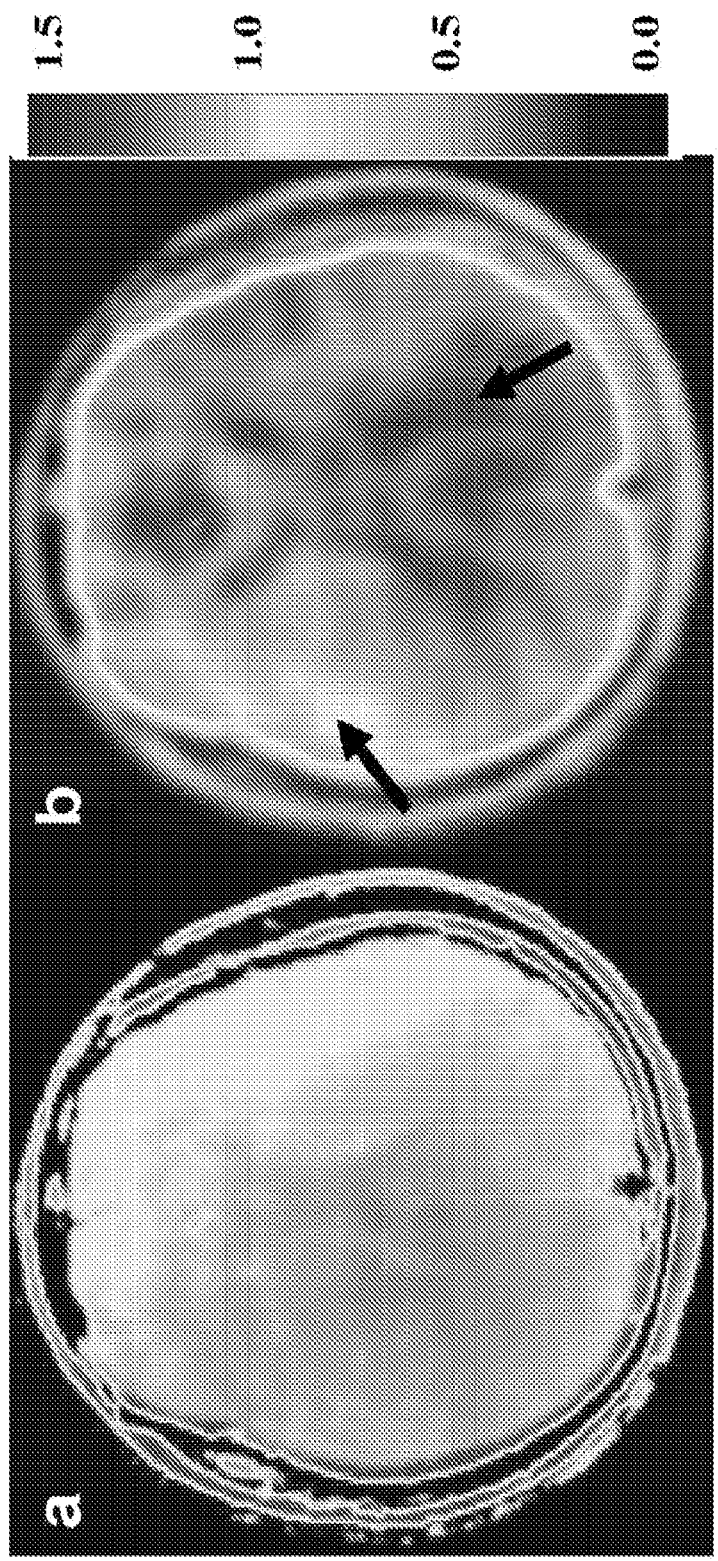
FIG. 5 illustrates an original phantom image acquired using a gradient echo sequence (a), a spin echo sequence (b) with body transmit coil and phased array receiver coil, and corrected images using the field map method (c,d), respectively.

Examples of the transmit field and receiver sensitivity maps measured in vivo are shown in FIG. 5. The CV of the transmit field and receiver sensitivity maps in FIGS. 5A and 5B of the brain tissues are 9.7 and 11.9%, respectively. In practical applications, the additional imaging time for estimating the $B_1^+$ and reception sensitivity maps must be minimized. Since $B_1^+$ and receiver sensitivity profiles vary slowly in space, $B_1^+$ and reception sensitivity maps at a low resolution can be obtained (reducing imaging time) and interpolated and registered to the to-be-corrected high-resolution images. For example, such maps covering the entire human brain with a low resolution are obtained using a segmented spin echo EPI sequence with a total acquisition time for transmit field and receiver sensitivity mapping of less than 2 minutes.

Figure 6:
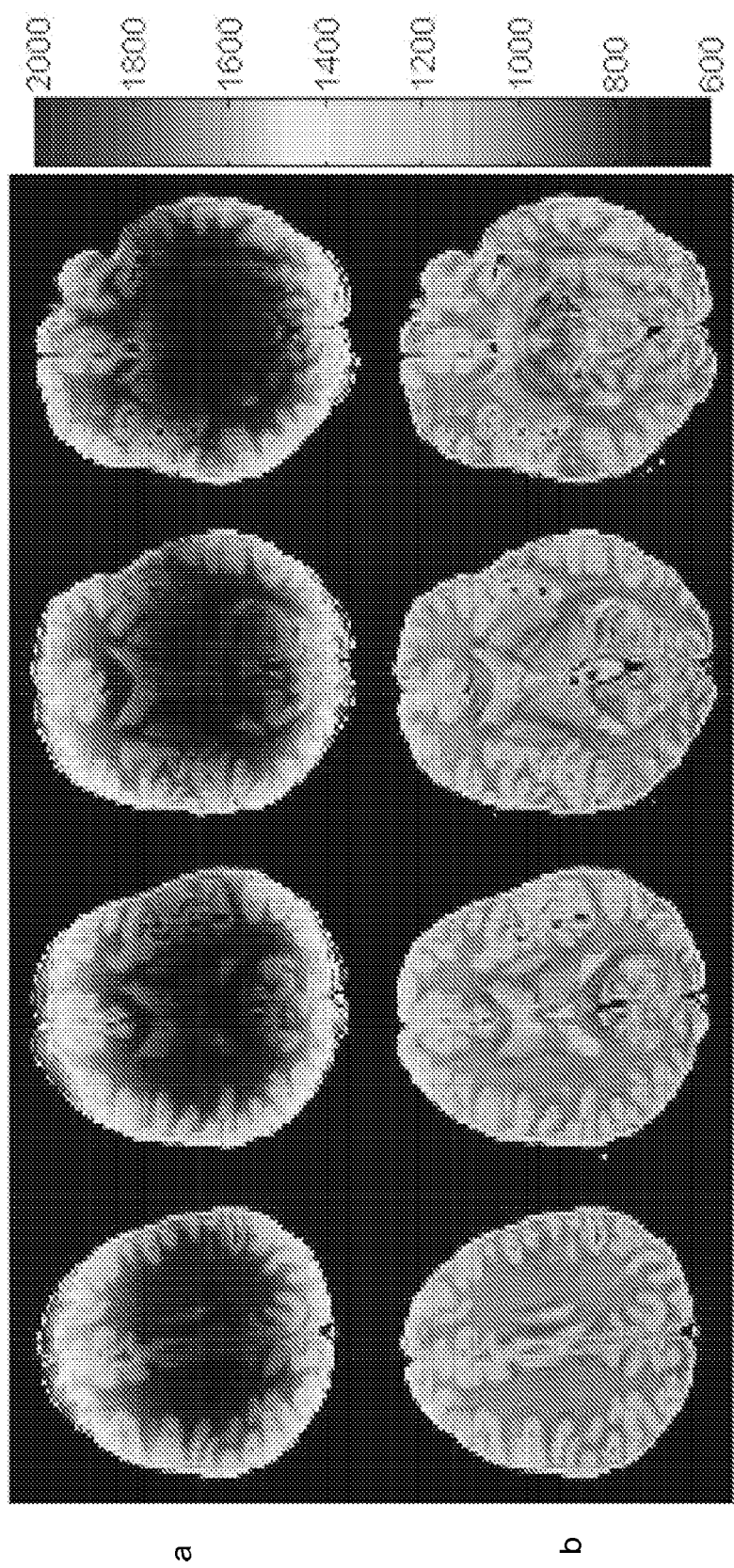
FIG. 6 illustrates an original brain image acquired using a segmented gradient echo planar imaging sequence (row a) with body transmit coil and phased array receiver coil, and corrected images using the field map method (row b), respectively.

FIG. 6 shows raw brain images acquired with gradient echo planar imaging sequence (row a) and their corrected images (row b). In the raw images, much higher signal intensities are observed at the boundary of brain and much lower signal intensities are at the center of the brain. That is, signal intensities of one of brain tissues exhibited big variability across the whole brain. The corrected images are corrected using Eqs. (1), (2) and (6) with the measured transmit field and receiver sensitivity. The results indicated that the signal intensity for one of brain tissues is more uniform across the whole brain.

Figure 7:
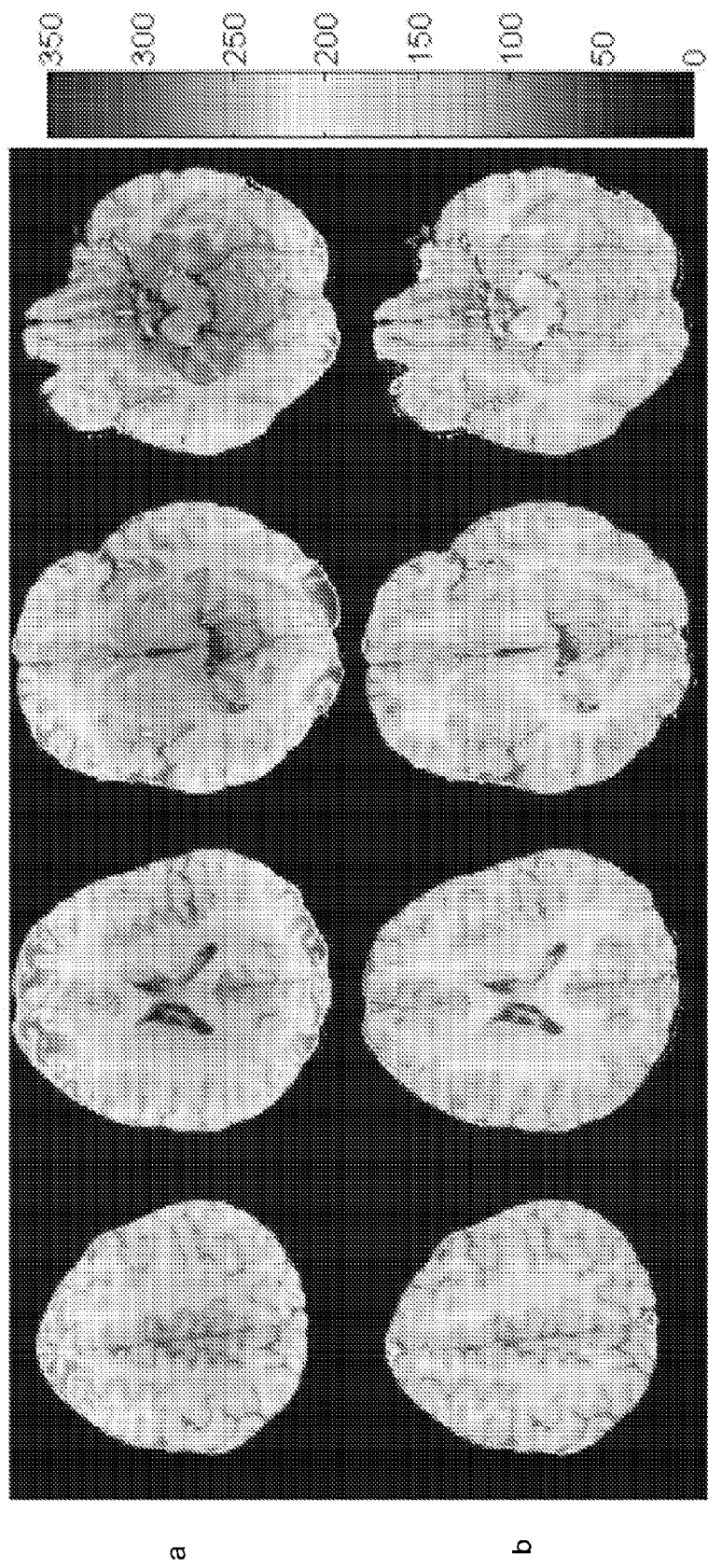
FIG. 7 illustrates an original brain image acquired using 3D FLASH (Fast Low Angle SHot Magnetic Resonance Imaging) sequence (row a) with body transmit coil and phased array receiver coil, and corrected images using the field map method (row b), respectively.

FIG. 7 (row a) shows a raw brain image acquired with 3D FLASH sequence. Signal inhomogeneity in the raw image led to much higher signal intensity of both GM and WM in the anterior and posterior regions of the brain than in the other regions. Receiver sensitivity and transmit field may be measured to correct signal inhomogeneity across the whole brain. The corrected image is shown in FIG. 7 (row b). After signal inhomogeneity correction, tissue intensities became much more uniform across the brain.

In FIG. 7, Signal inhomogeneity was corrected using the correction matrix that is independent of brain tissue characteristics because signal inhomogeneity mainly results from non-tissue characteristics: transmit field and receiver sensitivity. For a long TR, the effect of tissue $T_1$ on the correction matrix is greatly reduced and negligible. The correction matrix can be simply estimated from measured FA and receiver sensitivity. However, for short TRs, the effect of tissue $T_1$ on the correction matrix cannot be ignored—the combined effects of local tissue $T_1$ and non-uniform FA must be considered. Since $T_1$ mapping is very time-consuming, the method involving $T_1$ and FA mappings for correcting the contribution of inhomogeneous transmit field has little merit in clinical settings. Conventionally, inhomogeneous signal and contrast intensities caused by transmit field is corrected through the applications of adiabatic pulses, compensation pulses, radiofrequency field shimming techniques, and parallel transmit techniques. The adiabatic pulse and compensation pulses may increase input energy and pulse duration, leading to the side effect of large specific absorption rate and long TE. Radiofrequency field shimming techniques and parallel transmit techniques need additional hardware. Herein, the average $T_1$ of GM and WM instead of local $T_1$ mapping may be used to correct signal inhomogeneity. Such approximation will lead to small errors in the estimated transmit function when tissue contrast is insensitive to the variation of FA. Additionally, two-dimensional transmit field and a receiver sensitivity map may be used to correct three-dimensional brain images well. This example demonstrates that the difference in pulse profiles between 2 and 3 dimensional transmit field and receiver sensitivity is ignorable.

Figure 8:
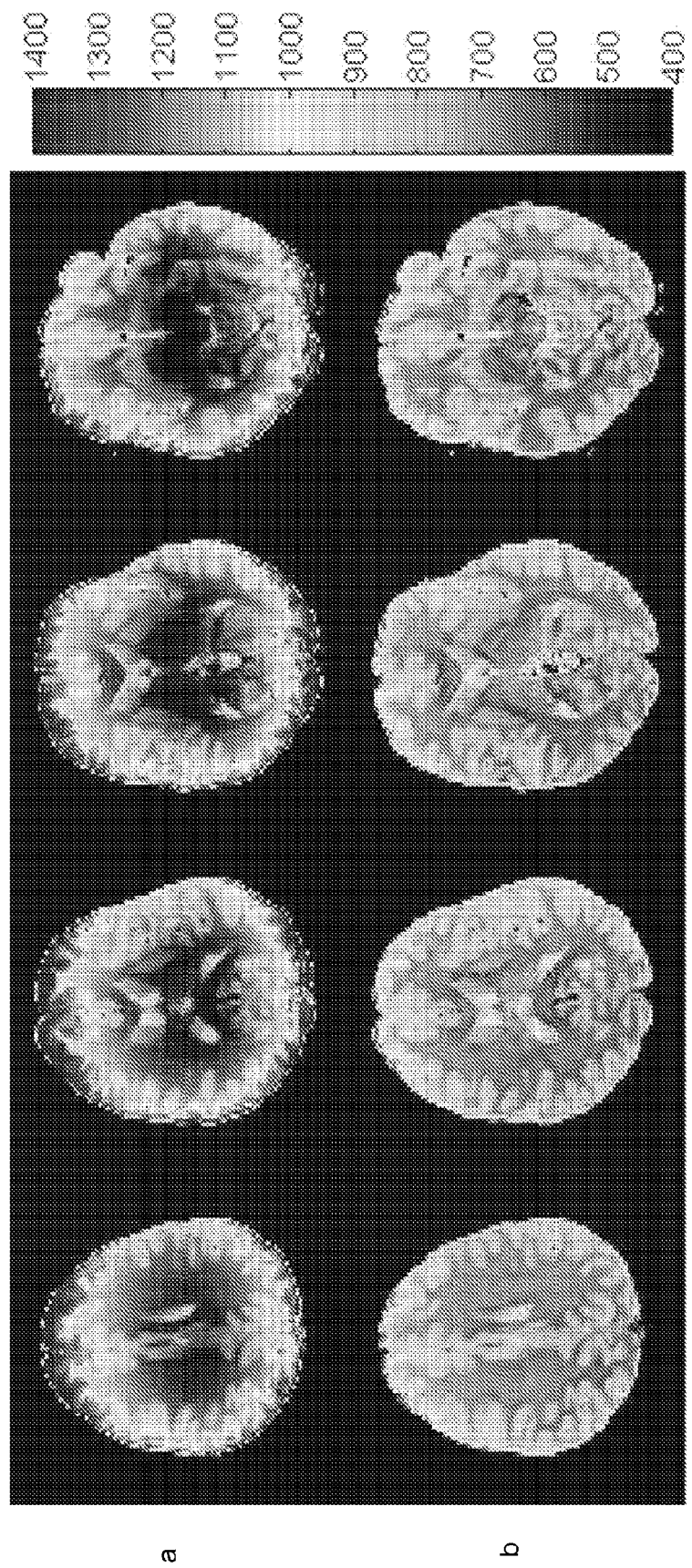
FIG. 8 illustrates an original brain image acquired using a segmented spin echo planar imaging sequence (row a) with body transmit coil and phased array receiver coil, and corrected images using the field map method (row b), respectively.

FIG. 8 exhibits the raw multi-slice images (row a) acquired with a spin echo EPI sequence and their corresponding corrected images with the proposed method (row b) for human brain, respectively. In the raw image, signal inhomogeneities of both GM and WM in the anterior and posterior regions of the brain are much higher than those in the other regions. Also the signal intensities at the center of brain are much lower than those in the other regions. After the correction, more uniform signal intensity results for the same brain tissue across the whole brain. Herein, it is assumed that 90° radiofrequency pulse has the same transmit field inhomogeneity as 180° refocusing pulse. It is reasonable for these routine pulses (e.g., hard pulse, sinc pulse, Gaussian pulse and truncated sinc pulse) because wave behavior is the dominant effect for transmit field inhomogeneity for a given coil configuration and loaded object. It is noticed that it may introduce big errors for adiabatic pulse, composite pulse.

Figure 9:
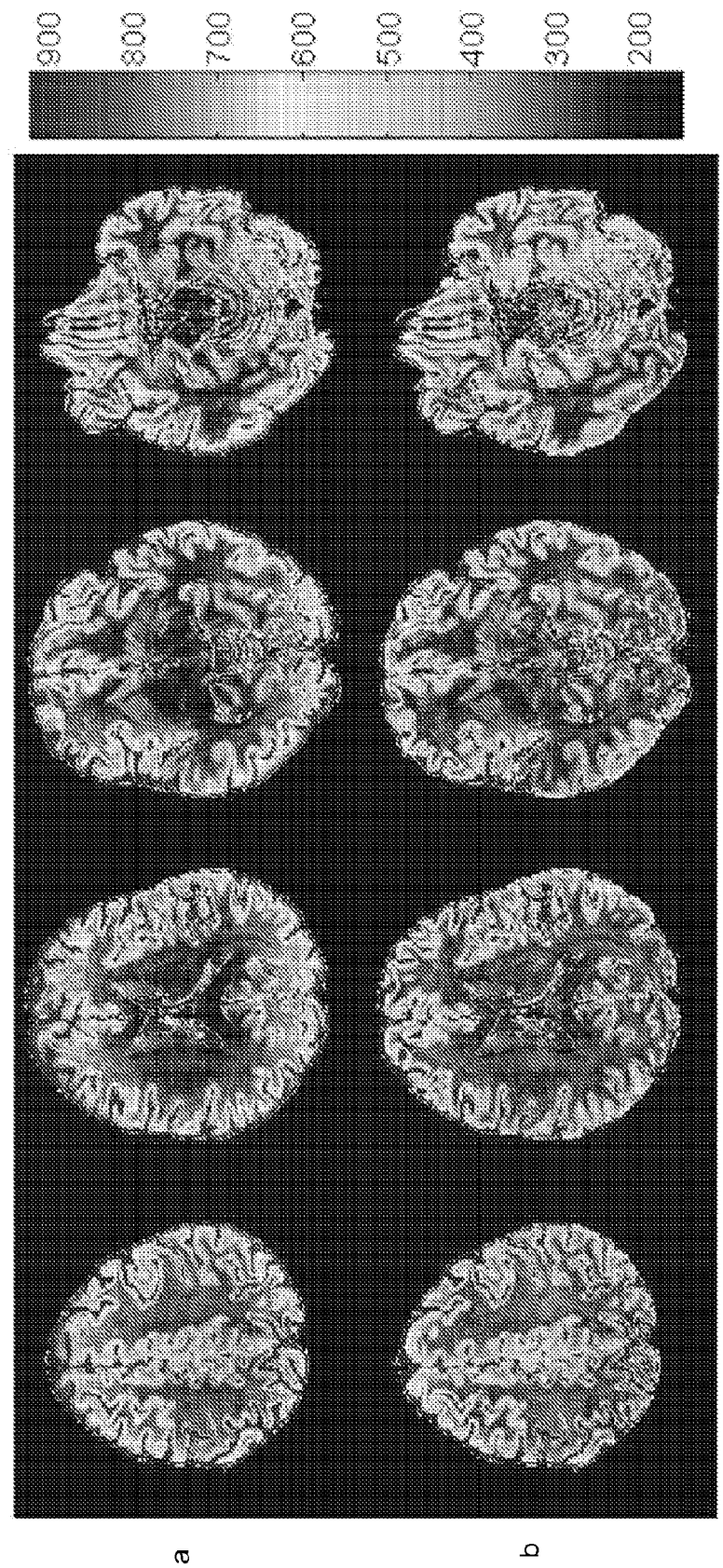
FIG. 9 illustrates an original brain image acquired using a fast spin echo or turbo spin echo sequence (row a) with body transmit coil and phased array receiver coil, and corrected images using the field map method (row b), respectively.

FIG. 9 exhibits the raw multi-slice images (row a) acquired with fast spin echo sequence and their corresponding corrected images with the proposed method (row b) for the human brain, respectively. In the raw image, signal intensities of both GM and WM in the anterior and posterior regions of the brain are much higher than those in the other regions. Also signal intensities at the center of brain are much lower than those in the other regions. After the correction, more uniform signal intensity is observed for the same brain tissues across the whole brain.

Figure 10:
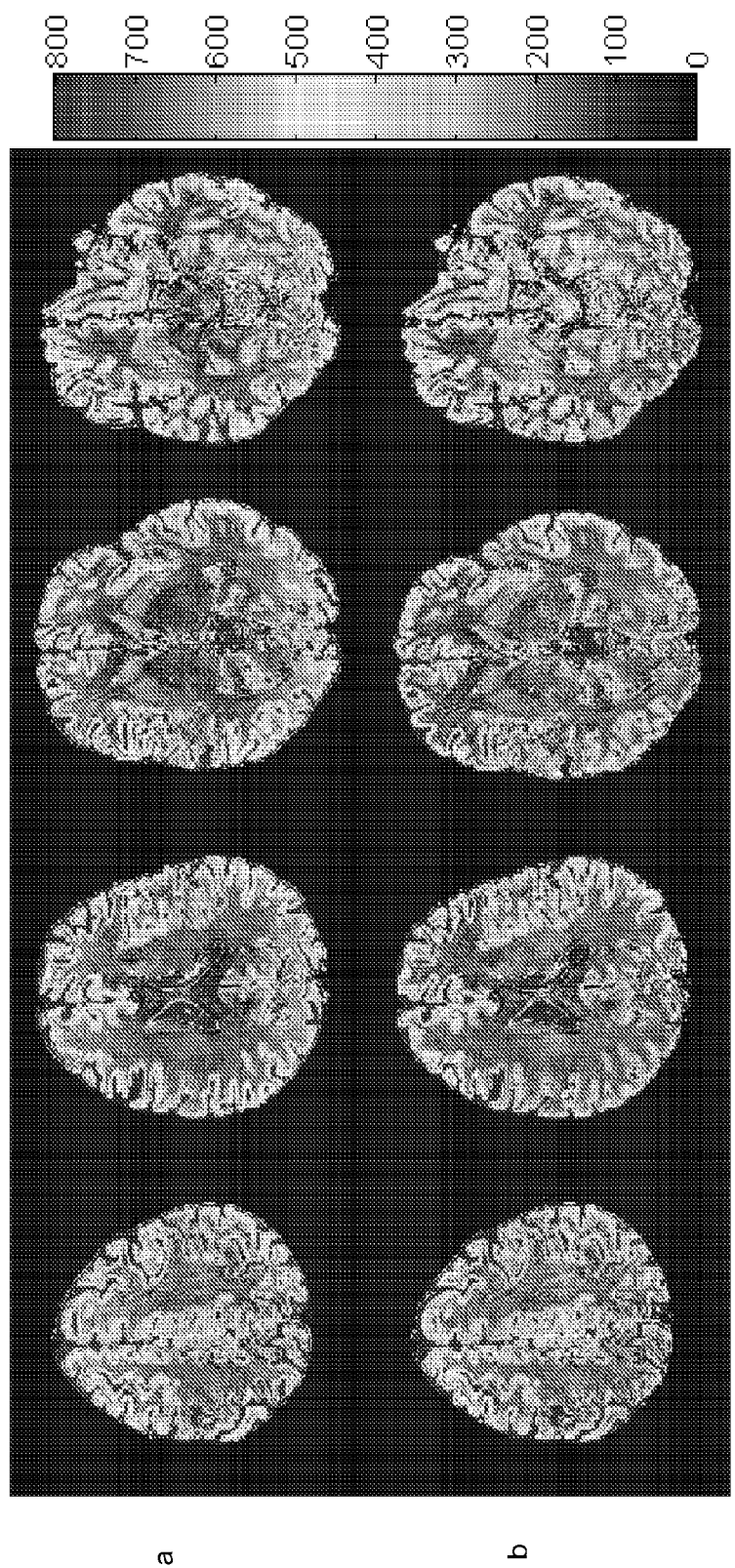
FIGS. 10a-b illustrate uncorrected multi-slice brain images acquired using an inversion recovery turbo spin echo sequence and the corresponding corrected images using the field map method.
Figure 11:
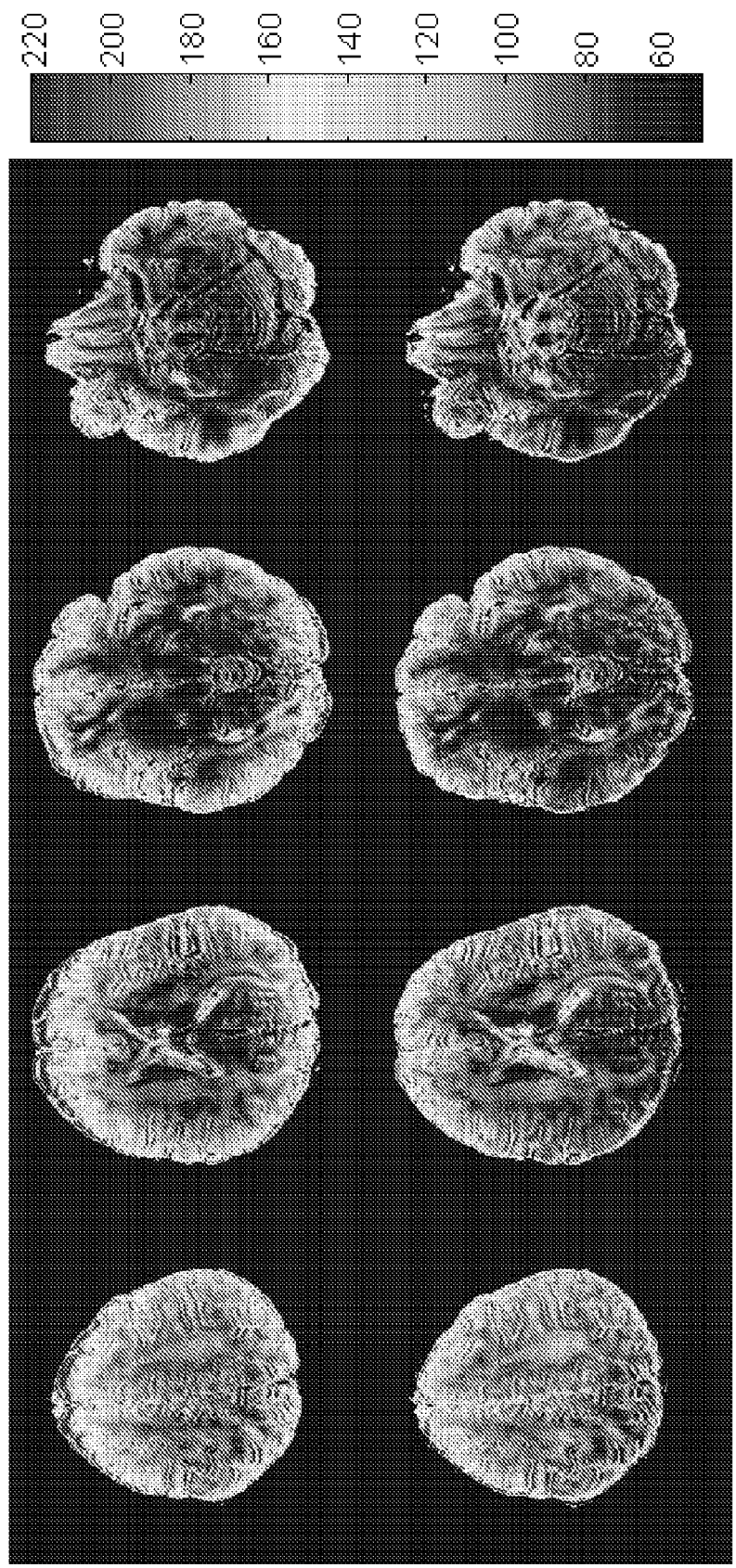
FIG. 11 illustrates an image of a human brain acquired with 3 dimensional inversion recovery fast spin echo sequences (row a) and corrected images using the field map method (row b), respectively.

Multi-slice brain images acquired using an inversion recovery spin echo sequence are shown in FIG. 10 (row a). The corresponding images shown in FIG. 10 (row b) are corrected using eqs. (1), (2) and (14) with measured transmit field and receiver sensitivity. The inhomogeneity of radiofrequency pulse, refocusing pulse and inversion recovery pulse may be separately measured. In order to save time, an assumption that a 90° radiofrequency pulse has the same transmit field inhomogeneity as both 180° refocusing pulse and inversion recovery pulse may be made. According to the measured transmit field map of radiofrequency pulse, the effect of radiofrequency pulse, refocusing pulse and inversion recovery pulse on the transmit function may be corrected using eq. (14). The corrected images exhibit better contrast among CSF, WM, and GM and a more homogenous distribution of intensities within each tissue group, relative to the uncorrected images. The results confirmed that our assumption FIG. 11 shows an image of a human brain acquired with 3 dimensional inversion recovery fast spin echo sequences (row a) and corrected images using the field map method (row b), respectively. In order to reduce specific absorption rate of 3 dimensional fast spin echo at comparable SNR and contrast, reduced flip angle and variable refocusing are used to generate the complex combination of spin echoes and stimulated echoes and a constant echo amplitude. When signal inhomogeneity is corrected, the refocusing flip angle should be the refocusing flip angle used to fill k-space center or k-space zero. Compared with the original images in row a, the corrected images in row b exhibit better contrast among CSF, WM, and GM and a more homogenous distribution of intensities within each tissue group, relative to the uncorrected images.

Figure 12:
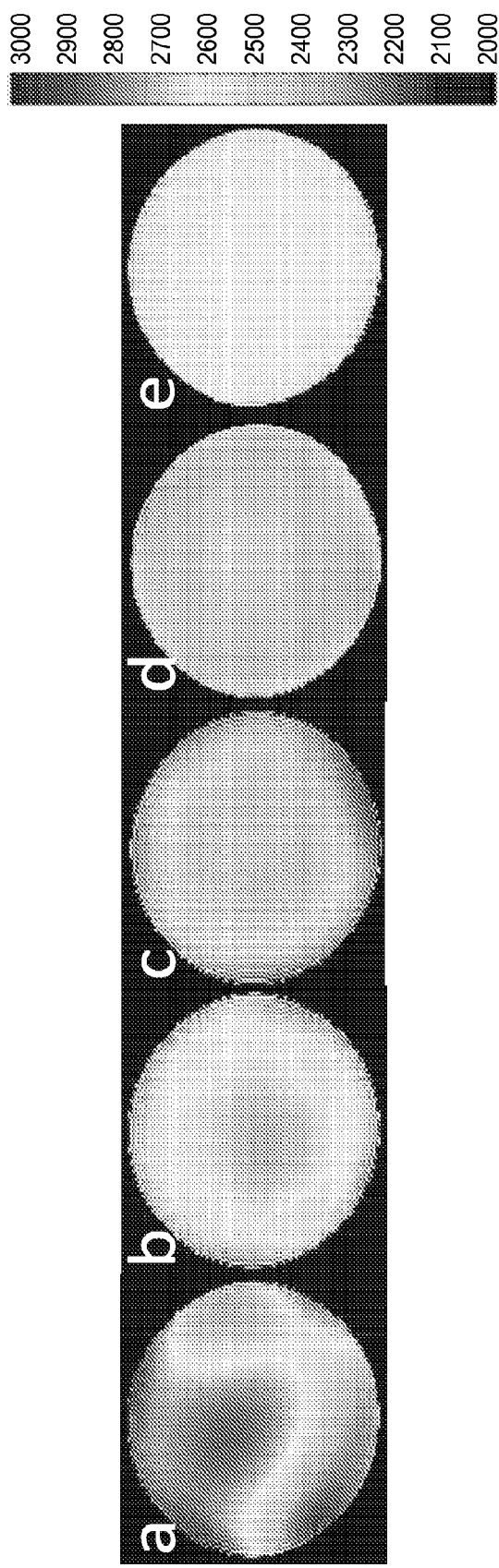
FIG. 12 illustrates an image of a uniform phantom (a) and corrected images using the Nonparametric non-uniform intensity normalization (N3) (b), Statistical Parametric Mapping (SPM) tool (c), FMRIB's Automated Segmentation Tool (FAST) (d) and the field map method (e).

FIG. 12 shows results of the corrected uniform phantom images using the field map method, N3, SPM, and FAST methods. Severe signal intensity inhomogeneities are observed in the raw image of the uniform phantom (FIG. 11a). The corrected images using N3 (b), SPM (c) and FAST (d) greatly improved the homogeneity of the raw image. However, these algorithms introduced new artifacts at the center and the boundary of the phantom image. The field map method (e), on the other hand, corrected the bias field remarkably and did not introduce any artifacts. The CV of the raw image is 11.9%. The field map method reduced CV to 4.0%, which mainly results from noise in the image.

Figure 13:
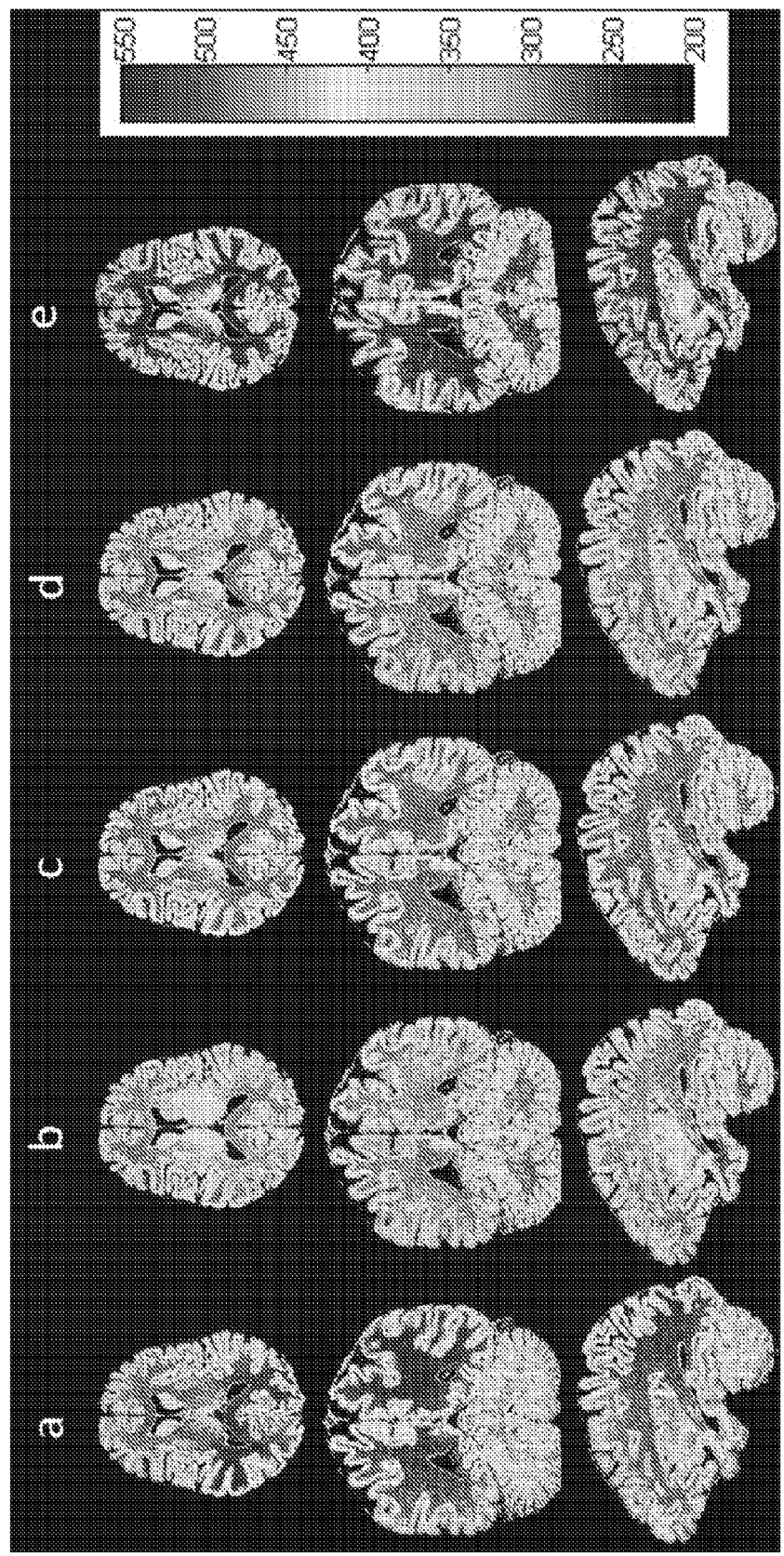
FIG. 13 illustrates an image of a human brain acquired with MPRAGE sequence (column a) and corrected images using N3 (column b), SPM (column c), FAST (column d) and the field map method (e).

FIG. 13 shows T1-weighted images of a human brain (column a), and the results after correction using N3 (column b), SPM (column c), FAST (column d), and the field map method (e). All methods produced reasonable good correction results. Image intensity homogeneity of each tissue type was greatly improved. However, the sharp boundaries between white matter (WM) and gray matter (GM) became blurry after N3, SPM, and FAST correction. The smoothed tissue boundaries and edge artifacts could lead to mis-quantification of tissue volumes. No tissue boundary blur resulted from the field map method. To quantify the quality of the images from the various correction methods, binary GM and WM masks were obtained using a segmentation algorithm, and then isolated GM and WM regions by multiplying the binary masks with the corrected images. CVs of the isolated WM and GM across the whole brain were computed. The results demonstrate that the field method map also outperformed the other methods on the human brain. The residue non-uniformities may come from the following factors: (1) location dependent signal intensity of the same tissue; (2) imperfect inhomogeneity correction, for example, the effect of imperfect inversion recovery is ignored in the field map method; and (3) non-optimal processing parameters.

Based on the foregoing, it should be appreciated that methods for correcting MR signal inhomogeneities are presented herein. Although the subject matter presented herein has been described in language specific to computer structural features, methodological acts, and computer readable media, it is to be understood that the invention defined in the appended claims is not necessarily limited to the specific features, acts, or media described herein. Rather, the specific features, acts and mediums are disclosed as example forms of implementing the claims.

What is claimed is:

1. A method of correcting for inhomogeneous signal intensity in an MRI image, the method comprising:
   acquiring a set of signal intensity images;
   estimating a receiver sensitivity map;
   estimating a transmit function based on a transmit field and Bloch's equation of the signal intensity images;
   calculating a transmit function with flip angle $\alpha_3$ according to Bloch's equation;
   estimating a relative correction image according to the transmit function and the receiver sensitivity map;
   registering the relative correction image with the set of signal intensity images to produce a relative correction image;
   normalizing the relative correction matrix to obtain a correction image; and
   correcting inhomogeneity in the signal intensity images comprising calculating a ratio of the signal intensity images and the correction image.

2. The method of claim 1, wherein estimating a receiver sensitivity map comprises using one of a signal intensity-based method and a field-based method.

3. The method of claim 2, wherein a signal intensity-based method is one of a pre-scan method, a minimal contrast method, a uniform magnetization method, and a bias field method.

4. The method of claim 2, wherein a field-based method is one of a rotating field method, a calibrated method, reciprocity principle of electromagnetic field, and an electromagnetic field method.

5. The method of claim 1, wherein estimating receiver sensitivity map is subject to both image domain data and k-space data operation.

6. The method of claim 1, wherein the transmit function is a constant for given regions of interest or given regions of interested components using a predetermined choice of imaging parameters.

7. The method of claim 1, wherein a constant $T_1$ and $T_2$ can be used to produce a transmit function which is independent of $T_1$ and/or $T_2$ across whole image if $T_1$ and/or $T_2$ across whole image are components dependent.

8. The method of claim 1, wherein the imaging parameters used for inhomogeneity correction should be effective imaging parameters.

9. The corrected method in claim 1, is employed to improve image quality or quantification of structural and/or functional MR imaging, MR spectroscopy and MR spectroscopy imaging.

10. The method of claim 1, wherein a signal inhomogeneity being corrected can be acquired by any magnetic resonance imaging sequence (such as gradient echo, spin echo, echo planar imaging, fast spin echo with or without both magnetization preparation pulses), and any transmit and receive coils.

11. The method of claim 1, wherein the image being corrected can be acquired by multi-radiofrequency pulses at least one of radiofrequency pulses, refocusing pulses, and magnetization preparation pulses.

12. A method of using a known phantom to evaluate performance of corrected images, comprising:
   acquiring an image of the phantom;
   correcting signal inhomogeneity of the image using one of a plurality of different correction methods wherein the different correction methods comprise non-uniform intensity normalization (N3) and the correction methods of the Functional Magnetic Resonance Imaging of the Brain (FMRIB) Software Library (FSL) and Statistical Parametric Mapping (SPM); and
   evaluating performance of a quality assessment of an image using the plurality of different correction methods,
   wherein the phantom is one of a uniform phantom, an American College of Radiology (ACR) phantom, and an object-like phantom.

13. The method of claim 12, wherein the object-like includes multi-tissues or multi-components whose MRI parameters, at least one of $T_1$, $T_2$, proton density, diffusion, magnetization transfer, perfusion, flow, conductivity, susceptibility, permittivity, geometry are similar or equal to that of region of interests of in vivo subject being imaged.

14. The method of claim 12, wherein a performance of different correction methods is evaluated comparison with a ground-truth.

15. The method of claim 14, wherein the ground-truth for image quality assessment is at least one of volume of multi-tissues, contrast, contrast-to-noise ratio, boundary sharpness, standard deviation of each tissue or component.

\* \* \* \* \*